United States Patent [19]
Berger et al.

[11] 4,009,333
[45] Feb. 22, 1977

[54] CHARGE TRANSFER IMAGE DEVICE

[75] Inventors: Jean-Luc Berger; Daniel Woehrn, both of Paris, France

[73] Assignee: Thomson-CSF, Paris, France

[22] Filed: Oct. 14, 1975

[21] Appl. No.: 621,749

[30] Foreign Application Priority Data

Oct. 18, 1974 France .................... 74.35146

[52] U.S. Cl. .................... 358/213; 250/211 J
[51] Int. Cl.² .................... H04N 3/02
[58] Field of Search .................... 178/7.1; 250/211 J, 250/578

[56] References Cited

UNITED STATES PATENTS 3,856,989  12/1974  Weimer .................... 178/7.1

OTHER PUBLICATIONS

Michael G. Kovac "Charge Transfer Image Sensor", 9-6-73, RCA Technical Notes.

*Primary Examiner*—Robert L. Richardson
*Assistant Examiner*—Edward L. Coles
*Attorney, Agent, or Firm*—Roland Plottel

[57] ABSTRACT

A solid-state image device comprising a matrix of m linear transfer registers, each comprising n charge coupled cells analyzes an optical image projected on to it and converts it into n × m electrical charges stored in the n × m cells. The extraction of these charges is effected register by register using original control means.

8 Claims, 7 Drawing Figures

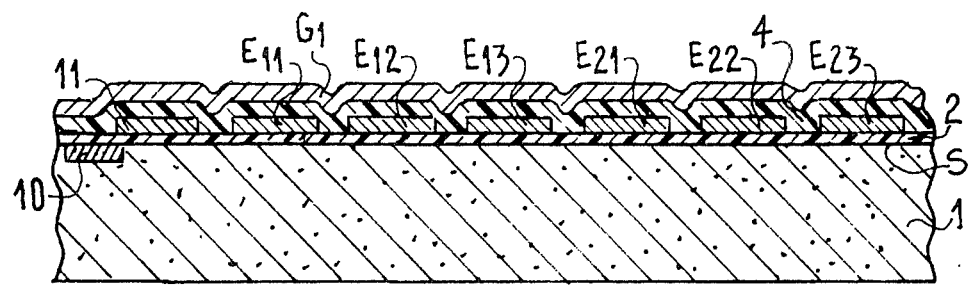
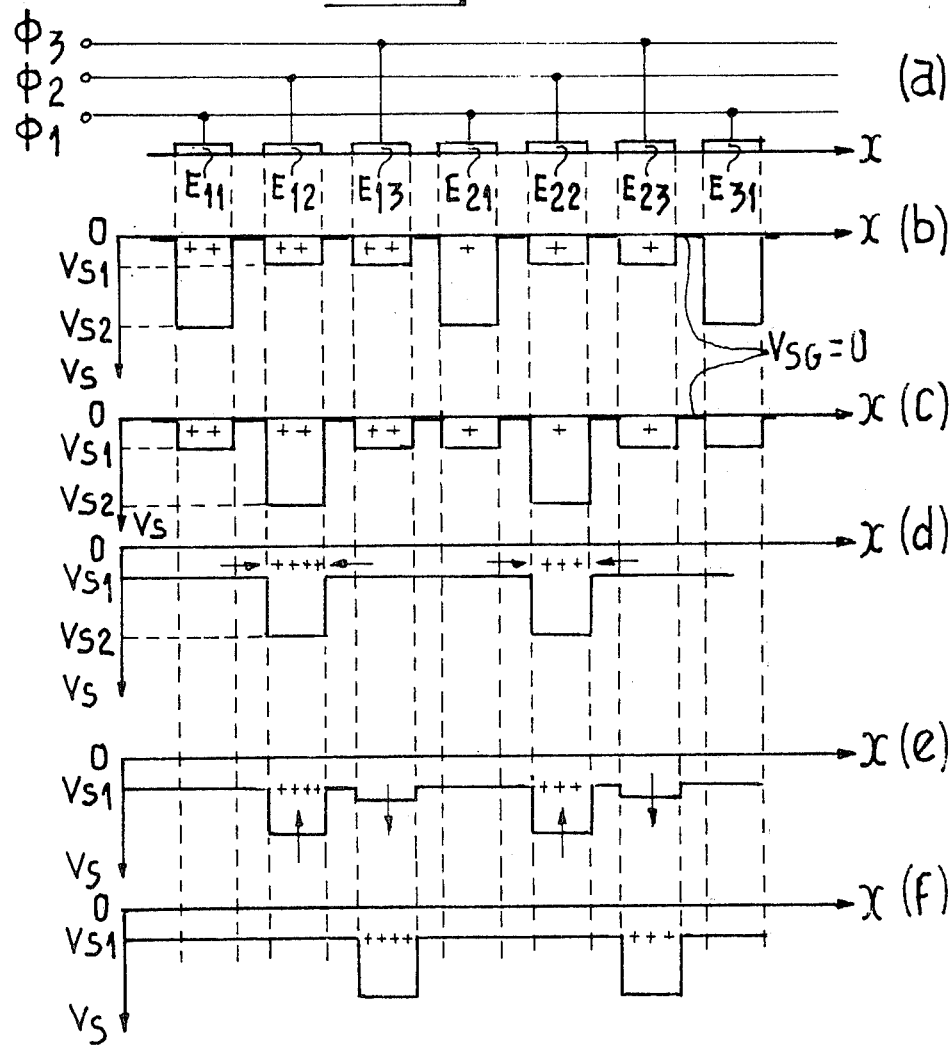

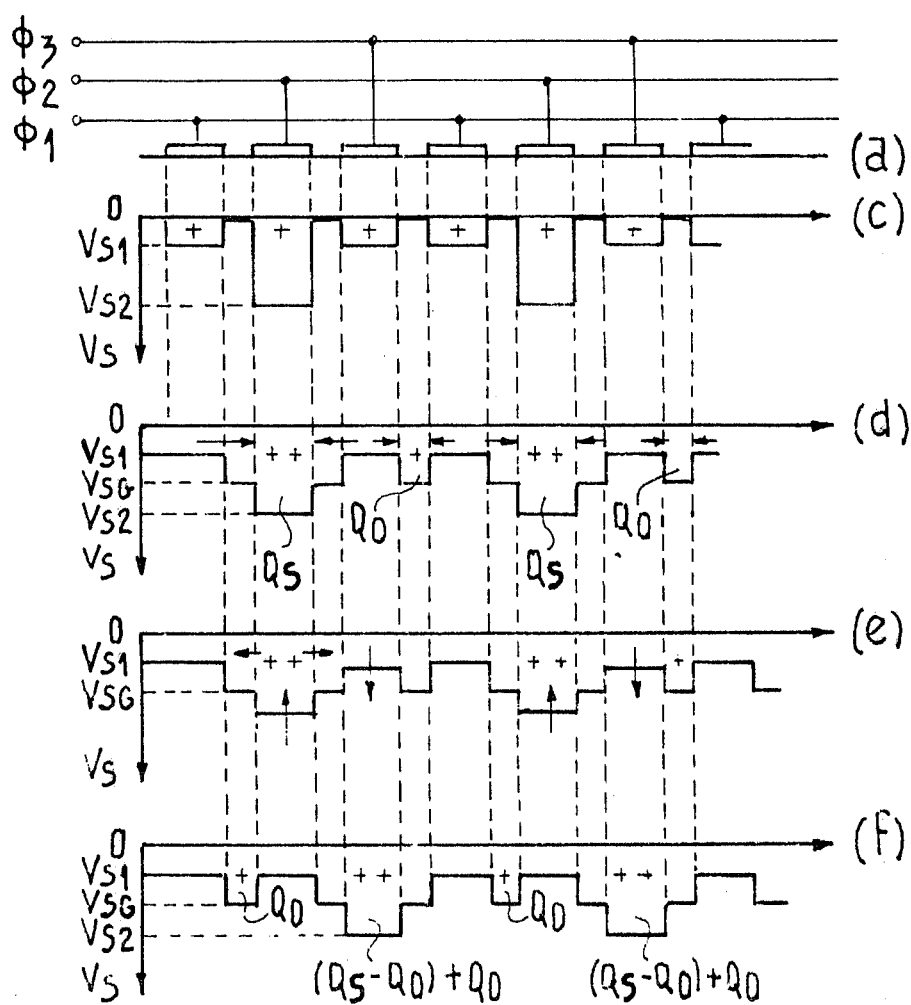

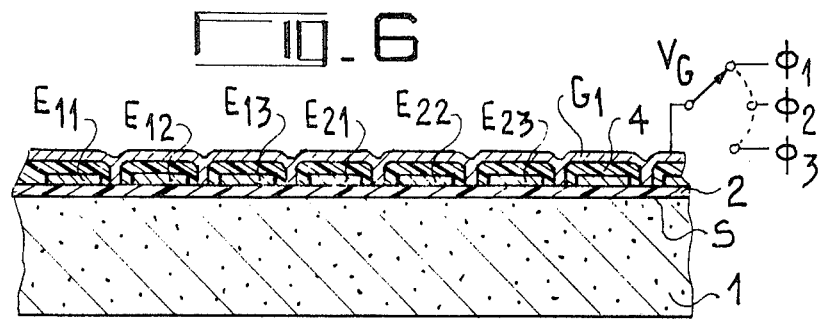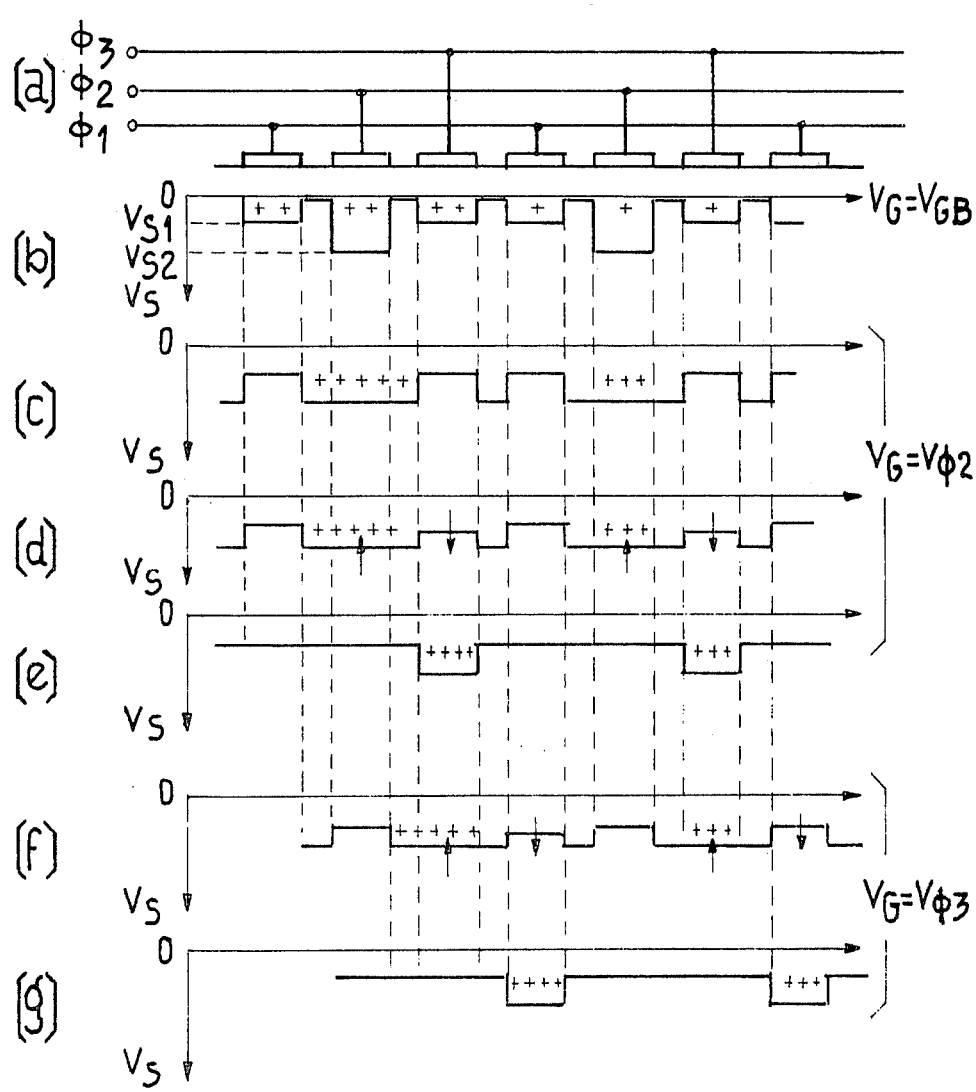

CHARGE TRANSFER IMAGE DEVICE

The present invention relates to a charge transfer image device or more particularly to a charge coupled image device.

The technique of charge coupled devices of C.C.D.s is now well-known, these devices having been described in terms of their basic principles in an article by W. S. Boyle and G. E. Smith entitled "Charge coupled semi-conductor devices" published in the magazine "The Bell System Technical Journal," April 1970, pages 587 to 593, or also in an article by M. F. Tompsett entitled "Charge transfer devices", published in the magazine "Journal of Vacuum and Science Technology," of July-August, volume 9, n° 4, pages 1166 to 1181.

These devices are utilised either to form linear n-cell registers in which there can be stored and from which there can be extracted, n pieces of digital or analogue information, or to form image devices making it possible to convert a two-dimensional optical image into an electrical signal sequentially furnishing information characteristic of the liminous intensity at the different elementary zones of the optical image; in the latter case, we are concerned with matrices comprising $n \times m$ charge coupled cells arranged in rows and columns and splitting the optical image which is to be analysed, into $n \times m$ elementary zones processed by each of the $n \times m$ cells in the matrix. Matrices of this kind which comprise exclusively solid-state device, are advantageously suitable for the replacement of conventional image devices utilising an electron beam as the scanning element.

In linear registers, the $n$ aligned cells are constituted by two or three (depending upon whether the register operates in two-phase or three-phase fashion) MIS (metal-insulator-semi-conductor) capacitors or MOS (metal-oxide-semi-conductor) capacitors, arranged side by side. Each cell stores the information which it receives, in the form of minority charge carriers in the doped semi-conductor used as substrate for the set of MIS capacitors of the register. Electrical charges constituting these minority charge carriers are stored in an inversion layer created at the insulator-semi-conductor interface in the MIS capacitors by the application to their metal electrode of a suitable voltage, higher in absolute value than a value $V_T$ referred to as the "threshold voltage." This kind of voltage produces in the semi-conductor, beneath the electrode in question, a "potential well" constituted in effect by a space charge zone depopulated of majority charge carriers which, when it reaches and exceeds said threshold value in absolute value, retains minority charge carriers in said inversion layer. These minority charge carriers, the quantity of which will be characteristic of the information, are generated in the semi-conductor either by an electrical input furnishing such charge carriers, the information for storage modulating a gate in order to allow more or less of them to pass, or by the production of electron-hole pairs through photon absorption, the quantity of light incident at each location and therefor on each cell, determining the quantity of minority charge carriers stored in each cell.

The information thus stored in a cell, can be transferred from cell to cell by the application of suitable voltages to the electrodes of their MIS capacitors. These voltages create beneath these electrodes, potential wells into which the charges are drawn. By displacing these wells along the register, the information is shifted and thus moved towards an electrical output furnishing a signal which sequentially reproduces the information injected either in series at the electrical input of the register or in parallel to the $n$ cells if it is an optical input which is involved.

To form an image matrix, several optical-input linear registers are arranged side by side, for exemple $m$ of them, each column of the matrix being constituted by a register whilst each row is constituted by the $m$ MIS capacitors of the same order, in each register. Each of the $n$ cells of each register integrates and stores in the form of charges held in the potential wells, information characteristic of the luminous intensity of the optical image at the elementary surface corresponding to said cell. The optical image thus fitted to $n \times m$ elementary areas, is converted at the matrix into an electrical image constituted by $n \times m$ charge quantites representative of the $n \times m$ luminous intensities at the $n \times m$ elementary areas. The major problem of these matrices is that of extracting the information thus stored in each cell of the matrix.

In other words, whilst row by row transfer is effected in parallel along the set of $n$ registers towards a linear output register from which the information will be extracted in series, the optical image continues to integrate at the matrix, producing erasing of the image. The transfer time required for extraction of a complete image is in other words long since it is necessary to empty an output register containing $m$ pieces of information, $n$ times.

To prevent this erasing of the image from taking place, which would otherwise render these matrices unusable, a prior art device proposes that the number of matrix rows be doubled in order to provide two zones having two different functions which cannot interfere with one another. In a first zone, at which the optical image for analysis is projected, integration of the optical information takes place with conversion into electrical charges stored in the MIS capacitor cells; in a second zone which is not supplied with the optical image, row by row extraction of the information takes place. Rapid row by row transfer makes it possible to pass the information stored in the first zone, to the second; the speed of this parallel transfer prevents image erasing from taking place. The serial extraction of each row can be performed slowly in the second zone, which is not exposed to the image.

An obvious drawback of this kind of system is that it is necessary to utilise a bulky and expensive matrix since $2 \times n \times m$ cells are needed instead of $n \times m$ cells, and twice the area.

One object of the invention is to form a solid-state image device in which the matrix for analysing $n \times m$ elementary areas of an optical image comprises only $n \times m$ charge coupled cells, whilst nevertheless making it possible to obtain a clean image which still has a high resolution.

According to the invention there is provided an image device of charge transfer type comprising:

a matrix of $m$ columns, each column constituting a linear transfer register of optical input type and including $n$ charge coupled cells;

first means for controlling transfer along said registers, said means being common to said $m$ registers;

second means for blocking said first means for controlling transfer, each of said $m$ registers being provided with such a second means, and said second means being independently controlled for blocking transfer along $m - 1$ of said $m$ registers and not blocking it along the $m^{th}$ register;

and further means for sequentially extracting the $n$ informations contained in the $n$ cells of each of said $m$ registers, in accordance with the $m$ independent transfer operations realised by the $m$ independent controls of said $m$ second means.

Thus, the transfer time of the register is sufficiently short for the information stored along the register not to be erased; as far as the other registers are concerned, they are not disturbed during this time since no transfer takes place there and since they continue to integrate normally the optical image they receive.

Other objects, features and results of the invention will become apparent from the following description given by way of non-limitative example and illustrated by the attached figures where:

FIGS. 2 and 3 are schematic views, taken in section in two directions at right angles to one another, of part of the matrix shown in FIG. 1;

FIGS. 4 and 5 are graphs illustrating the operation of an image device in accordance with the invention, in the form of two embodiments;

FIG. 6 is a schematic view of part of a variant of a matrix in accordance with the invention;

FIG. 7 provides graphs illustrating the operation of an image device utilising a matrix in accordance with FIG. 6.

In the description which now follows and in the associated figures, the charge transfer devices used are three-phase devices; it goes without saying that the invention applies equally to two-phase devices which are known per se.

As briefly described hereinbefore, a solid-state image device in accordance with the invention comprises a matrix of $n \times m$ charge coupled cells arranged in $m$ columns of $n$ cells each. Since we are concerned here with three-phase transfer devices, each cell comprises three adjacent MIS capacitors defined by three conductive electrodes.

Figure 1:
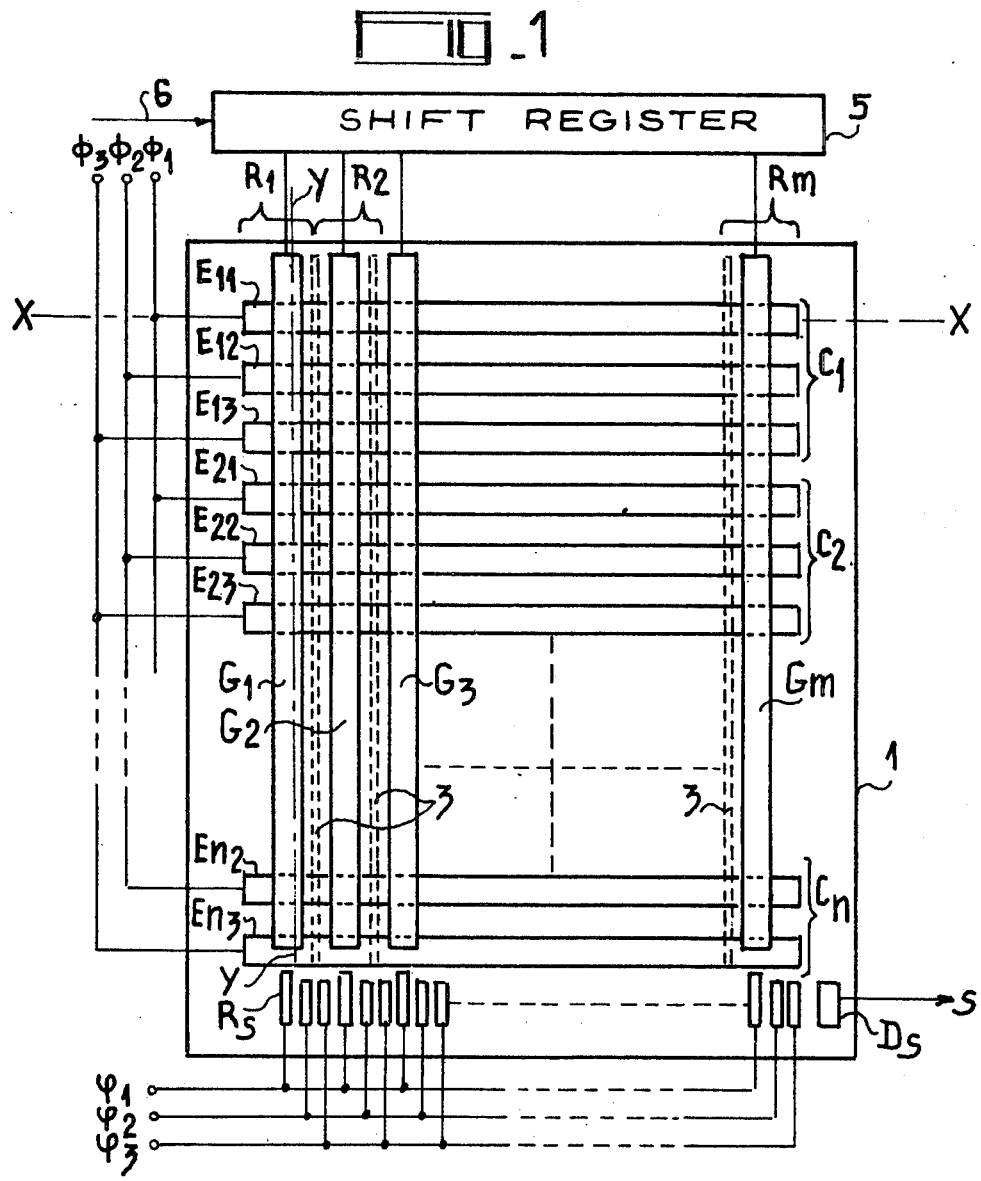
FIG. 1 is a schematic view of an image device in accordance with the invention.

Each column of the matrix is in fact a linear register $R_1$, $R_2$—$R_m$ in FIG. 1, made up of $n$ cells $C_1$, $C_2$—$C_n$ each comprising three MIS capacitors.

Figure 2:
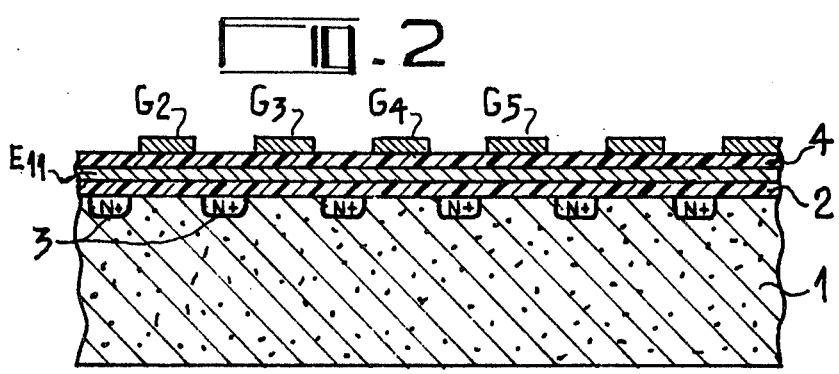

In accordance with a fundamentally conventional arrangement, encountered in matrices of this kind, the $m$ registers are formed upon one and the same semiconductor substrate 1 as FIGS. 1, 2 and 3 show where identical references indicate identical elements.

The substrate 1 will for example be of N-type silicon covered with a dielectric layer 2 which, for example, may be constituted by silicon dioxide. Conductive electrodes, three per cell namely $E_{11}$, $E_{12}$, $E_{13}$, in the case of the first cell of the register $R_1$, $E_{21}$, $E_{22}$, $E_{23}$ in the case of the second cell and so on, are deposited upon the layer 2 in order to form the MOS capacitors of the charge coupled cells.

As FIGS. 1 and 2 show, the electrodes $E_{11}$, $E_{12}$— are common to the set of registers $R_1$—$R_m$; in order to prevent mixing between the charges stored in a cell of one register and the charges stored in the neighbouring cells of neighbouring registers, or, in other words, to effectively delimit $m$ MOS capacitances along one and the same electrode $E_{11}$—$En_3$ and create $m$ separate register $R_1$—$R_m$, the matrix is split into columns by for example carrying out upon the substrate1, beneath the oxide layer 2, diffusion operations producing $N^+$-type conductivity, in the form of parallel, equidistant bands 3. These bands 3 of $N^+$-type material produced by diffusion operations, have a higher threshold voltage than does the substrate N. By using for the control voltages applied to the electrodes, both for integration and for transfer, values ranging between the threshold voltage of the MOS capacitors and that of the $N^+$ diffused regions, the potential wells produced beneath the different registers $R_1$—$R_m$ are effectively isolated from one another. Other methods of isolation are already known; they, too, can be applied in this context.

The electrodes $E_{11}$, $E_{12}$— are connected together three at a time since we are concerned here with a device operating in accordance with three phases $\phi_1$, $\phi_2$, $\phi_3$ at which, as we shall see later on, there are applied the control, recording and transfer voltages.

A linear output register $R_s$ constituted by $m$ cells, with three electrodes for example if we are concerned once again with a register having three phases $\phi_1$, $\phi_2$, $\phi_3$, is arranged on the same substrate 1 as the matrix itself. This register $R_s$ is designed to transmit to an output diode $D_s$ furnishing an electrical signal s, the charges characteristic of the recorded information which it receives from the matrix of $n \times m$ cells.

In accordance with the invention, means are provided in order to control the transfer of the charges stored in the cells of the matrix, register by register. Whilst one of the $m$ registers $R_1$—$R_m$ is emptying into the output register $R_s$, the latter is transferring the information it contains at the same rate, to the output diode $D_s$, its three phases $\phi_1$, $\phi_2$, $\phi_3$, being associated with the application of appropriate control voltage in synchronism with those of the phases $\phi_1$, $\phi_2$, $\phi_3$ of the matrix; during this same period of time, the means in accordance with the invention block transfer along the $m$-1 other registers in which the image continues to integrate and be stored.

The time required to empty a register is sufficiently short to prevent part of the image stored in the register from being disturbed; as far as the other registers are concerned, they are of course undisturbed anyway since no transfer takes place there.

The invention will now be described in more detail in the context of a method of creating said means used to control transfer, register by register.

Considering FIGS. 1, 2 and 3 again, a conductive band $G_1$, $G_2$—$G_m$ can be seen covering each register $R_1$—$R_m$ and insulated from its electrodes by an insulating layer 4. These conductive bands are for example bands of aluminium if the image to be analysed is projected upon the free face of the substrate 1; if it is projected through said bands, then the latter must of course be made of a transparent or semi-transparent conductive material, as also must the other layers arranged between the image and the substrate. As far as the layer 4 is concerned, this is an oxide for example, produced by a thermal process on the overall matrix; in this case, the electrodes $E_{11}$, —$En_3$ will be made of a refractory metal, for exemple polycrystalline silicon.

As FIG. 3 shows, a voltage applied to the band $G_1$ of the grid thus formed on the matrix by the set of bands $G_1$ to $G_n$, will control the potential $V_s$ at the interface S, in the interelectrode spaces. By varying this potential, it is possible to inhibit or enable transfer along the register, in the manner described later on in the context of FIG. 4.

In this figure, at (a) there have been schematically illustrated the electrodes $E_{11}$, $E_{12}$, $E_{13}$ viewed in section along a register (as in FIG. 3), although in order to simplify the illustration the semi-conductor, the different oxide layers and the conductive band $G_1$, have been omitted.

At (b), (c), (d), (e) and (f), there have been illustrated the graphs plotting the variation of the potential $V_s$ at the interface S between silica and silicon, as a function of thd distance x along the register. These graphs correspond, at (b) and (c), to the absence of any transfer and at (d) and (f), to various moments in a transfer operation.

In order to obtain the potential configuration represented by graph b, the band $G_1$ is raised to a voltage $V_{GB}$ known as the "blocking" voltage, such that the interface potentials $V_{SG}$ in the inter-electrode spaces, are at the reference potential of for example 0 volts. As far as the interface potentials beneath the various electrodes are concerned, these are defined by the voltages applied at the phases $\phi_1$, $\phi_2$ and $\phi_3$. The choice of these voltages is fundamentally effected in accordance with the now classic rules governing charge transfer devices; in the present case, however, matters are slightly different.

The graphs (b) and (c) correspond to absence of transfer along the register $R_1$ since the grid $G_1$ creates between the electrodes, potential barriers which the charges stored in the potential wells present beneath the electrodes, cannot overcome. They therefore correspond to an image integration period by the register $R_1$. However, whilst this integration is taking place, one of the m-1 other registers is in the transfer phase; the voltages applied to its electrodes by phases $\phi_1$, $\phi_2$ and $\phi_3$ thus switch between two values, one of which is more negative than the other in order for transfer to be possible in the register in question. The register $R_1$ will therefore pick up and store charges in the three MOS capacitors of each of its cells, whereas normally only one of its three cells will actually perform a storage function. It is therefore necessary to use negative voltages $V_1$ and $V_2$ between which the phases are switched, in order to make it possible both to effect transfer along the register in question and integration of the charges beneath the other registers. Advantageously, the the condition $|V_T|<|V_1|<|V_2|$ will be chosen, where $V_T$ is the aforedefined threshold voltage.

The fact that $|V_1|$ is less than $|V_2|$, enables charge transfer to take place appropriately in the register in question, from the capacitors controlled by the voltages $V_1$ to the neighbouring capacitors controlled by the voltages $V_2$; the interfaces S controlled by the voltages $V_1$ and $V_2$, are respectively at the potential $V_{S1}$ and $V_{S2}$.

The fact that $|V_1|$ and $|V_2|$ are both greater than $V_T$, makes it possible for integration and storage to take place appropriately in the m-1 registers in which there is no transfer, this despite the existence of transfer in the $m^{th}$ register.

In other words, in the registers which are carrying out integration, the three MOS capcitors of each cell will successively have their electrodes placed at $V_1$ since one of the m registers is always in the transfer state. It is therefore necessary for the MOS capacitors receiving the potential $V_1$, to be able to retain the positive charges which are stored there; this is why it is necessary for the condition $|V_1|>|V_T|$ to be satisfied. Thus, the positive charges which are attracted, at the time of an integrating operation, to the capacitors exhibiting the deepest potential wells, that is to say those driven by the voltages $V_2$, remain there when these capacitors receive the voltages $V_1$. The three capacitors of each cell will therefore integrate and store charges; it is this situation which is indicated by the positive charges shown in graphs (b) and (c) in the potential wells present beneath the three electrodes of each cell.

When it is required to effect control of transfer along a register, $R_1$ for example, so that the information the register contains is filled into the output register $R_s$, the voltage applied to the band $G_1$ is switched to a negative value $V_{GT}$ known as the transfer voltage. The value of this transfer voltage $V_{GT}$ depends upon the embodiment considered; in all cases, it must be such that the potential $V_{SG1}$ at the interface S, in the inter-electrode spaces, obeys the condition:

$$|V_{S1}| \leq V_{SG1} < |V_{S2}|$$

In the case shown in FIG. 4, in which no account has been taken of the conventional problems of surface condition, whether these be resolved by the use of additional means or again whether there are no such problems, since transfer is effected for example volumetrically in accordance with techniques known per se, $V_{GT}$ is chosen so that $V_{SG1} = V_{S1}$ applies, as illustrated by the graph (d) which corresponds to the start of transfer. Whilst this voltage $V_{GT}$ is applied to the band $G_1$, the other registers have the blocking voltage $V_{SB}$ applied to their conductive bands $G_2$—$G_m$.

During a first transfer time, which is that shown at (d), the charges stored in the three MOS capacitors of each cell are combined in one and the same capacitor, namely that whose potential well is the deepest; in this case beneath the electrodes $E_{12}$, $E_{22}$, —$E_{n2}$.

During a second time, when the voltages $V_1$ and $V_2$ are switched, the phase $\phi_2$ changes from $V_2$ to $V_1$ whilst the phase $\phi_3$ changes from $V_1$ to $V_2$, the phase $\phi_1$ remaining at $V_1$, transfer takes place normally along the register $R_1$, the charges passing from the electrodes connected to the phase $\phi_2$ to beneath those connected to the phase $\phi_3$, as shown by graphs (e) and (f). Following this, it is at phase $\phi_1$ at which switching from $V_1$ to $V_2$ takes place, whilst at phase $\phi_2$ switching from $V_2$ to $V_1$ takes place, the charges then passing to positions beneath the electrodes connected to $\phi_1$, etc.

A control element 5, such as a shift-register with m stages, applies to all the bands $G_1$—$G_m$ with the exception of one, the voltage $V_{GB}$ which blocks transfer along the corresponding registers. Each of the m stages of the register 5 in turn applies to the band which it controls, the transfer voltage $V_{GT}$. This switching of the transfer voltage from one band to the next in the grid $G_1$—$G_m$, takes place in accordance with a rhythm which depends upon the duration $\tau$ of the elementary transfer of a linear register, that is to say upon the transfer time elapsing between one MOS capacitor and the next, and upon the number of cells in the register; for this to happen, the input 6 of the shift-register 5 controlling said switching operation is synchronised with the clock controlling the switching of the phase $\phi_1$, $\phi_2$ and $\phi_3$.

The means just described and consisting in inhibiting or enabling transfer operations along registers, with the help of a conductive grid biased by different voltages, offer a certain number of additional advantages.

In other words, at the time of transfer, the inter-electrode spaces ar suitably biased by said grid and one conventional problem of charge coupled devices, that of the potential barrier created due to these spaces, no longer arises. In other words, the electrodes can be fairly well spaced apart, in particular at intervals of more than 3 microns, a dimension which is normally critical in devices of this kind. The result is a simplification in the manufacture of the matrix, since the tolerances in the photogravure operations can be much wider.

Another advantage is concerned with the problem of "surface states" or traps which, at the silica-silicon interface S, may rapidly trap part of the data charges during transfer operations, releasing them only slowly whilst transfer operations carry on; so that the efficiency of the transfer operations is reduced.

It is known to permanently saturate these surface states beneath the electrodes, by supplying background charges to the registers, using an electrical input; by biasing all the electrodes of the registers in order to maintain space charge beneath its electrodes, the background charges permanently saturate the surface states there. By contrast, in the inter-electrode spaces or "gaps," the surface states are unsaturated since there is no permanent background charge. In the matrices in accordance with the invention, the inter-electrode spaces of the registers also exhibit space charge zones during transfer operations, due to the presence of the bands $G_1$—$G_m$ negatively biased by the transfer voltage $V_{GT}$; if $V_{GT}$ is greater in absolute value than the threshold voltage $V_T$, they may even in fact exhibit inversion layers capable of retaining positive charges. It is thus possible to saturate the surface states not merely beneath the electrodes but also between them, as we shall see from a consideration of FIG. 5.

To do this, a basically conventional electrical input, schematically illustrated in FIG. 3 by the diode 10 and the gate 11, makes it possible to apply to each register a background charge $Q_o$. Before performing analysis of an image, all the bands $G_1$—$G_m$ are placed at the transfer potential $V_{GR}$ which is in this instance greater in absolute value than the threshold voltage $V_T$, and, by controlling the opening of the gate 11, the background charge $Q_o$ is allowed through. Transfer along all the registers is produced in order to fill them with said background charge. Also, the gate 11 supplying a register with the background charge $Q_o$ is opened every time transfer along said register is effected.

The preliminary operation of filling the registers with the background charge having thus been performed, the image is then analysed in a manner described earlier. When the grid bands $G_1$—$G_m$ are placed at the blocking voltage $V_{GB}$, graph (c) of FIG. 5, the charges forming the background charge and previously stored in the inversion layer and the inter-electrode spaces, enter the space charge zones beneath the electrodes; the MOS capacitors thus store not only the charges $Q_s$ corresponding to the image being analysed, but also the background charge $Q_o$.

When transfer is effected along a register, graph (d) of FIG. 5, the charges $Q_s$ corresponding to the image regroup beneath the electrodes exhibiting the deepest potential wells, whilst the charges $Q_o$ enter the potential wells created beneath the interelectrode spaces by the grid potential $V_{GT}$.

When transfer continues thereafter, graphs (e) and (f), the surface states being saturated throughout by $Q_o$, and this includes locations between the electrodes, the charges characteristic of the information are transferred integrally.

FIG. 6 schematically illustrates, in section along a register such as that $R_1$, a variant embodiment of a matrix in accordance with the invention, differing from that of FIG. 3 in terms of the geometry of its oxide layer 4; FIG. 7 makes it possible to understand how this variant embodiment operates.

We are concerned here, as in the case of FIG. 4, with charge transfer registers in which the surface states are ignored, especially for example if we are dealing with registers operating by volumetric transfer, sometimes also referred to as "buried channel" registers, where these surface states are not involved in the transfer operation.

It is useless in this case to maintain inversion layers beneath the inter-electrode spaces and transfer operations can be performed by switching to that band of the register which is involved, band $B_1$ in the register $R_1$ for example, the voltage applied at the phases $\phi_1$, $\phi_2$ and $\phi_3$, as indicated in FIGS. 6 and 7.

During a first period, in a manner identical to that taking place with the two previous cases, the potential on $G_1$ is a blocking potential $V_{GB}$, graph (b).

During a time corresponding to the regrouping of charges beneath the central elecrtrodes of the cells, that is to say those connected to $\phi_2$, graph (c), and to the transfer of charges from these electrodes towards those connected to $\phi_3$, graphs (d) and (e), the potential on $G_1$ will at any instant be that of $\phi_2$. Thus, since no charge is left behind in the manner which was the case in FIG. 5, the dynamic range of the device is increased so that it can analyse information of higher amplitude; moreover, and in contrast to what happened in the case of the device of FIG. 4, the potential on the interface S at the inter-electrode space between two capacitors between which transfer is taking place, in all cases being intermediate between the interface S potentials of these two capacitors, transfer is more uniform than in the case of FIG. 4.

When transfer of charges from the electrodes connected to phase $\phi_3$ is taking place to those connected to phase $\phi_1$, graphs (f) and (g), the potential on $G_1$ is switched to $\phi_3$ so that $V_{G1} = V_{\phi\,3}$ . . .

To achieve this kind of operation, the matrix is designed in the manner shown in FIG. 6; the aluminium layer constituting the grid bands $G_1$—$G_m$ is separated, at the inter-electrode spaces, from the semi-conductor 1 by the same thickness of oxide 2 as the electrodes of the register.

What is claimed is:

1. An image device of charge transfer type comprising:
   a matrix of $m$ columns, each column constituting a linear transfer register of optical input type and including $n$ charge coupled cells;
   first means for controlling transfer along said registers, said means being common to said $m$ registers;
   second means for blocking said first means for controlling transfer, each of said $m$ registers being provided with such a second means, and said second means being independently controlled for blocking transfer along $m - 1$ of said $m$ registers and not blocking it along the $m^{th}$ register;
   and further means for sequentially extracting the $n$ informations contained in the $n$ cells of each of said $m$ registers, in accordance with the $m$ independent transfer operations realised by the $m$ independent controls of said $m$ second means.

2. An image device as claimed in claim 1 wherein said further means for the sequential extraction of the informations contained in the $n$ cells of each register, in accordance with the transfer operations taking place in said register, comprise a linear output transfer register ($R_s$) arranged on the same substrate as said $m$ registers of the matrix, said output register comprising $m$ cells receiving the charges furnished by each of the $m$ registers of the matrix, and directing them to an output element ($D_s$).

3. An image device as claimed in claim 1 wherein the linear transfer registers are three-phase registers.

4. An image device as claimed in claim 1, in which the cells of said registers are made up of MIS capacitors delimited by conductive electrodes ($E_{11}$, $E_{12}$—) formed on an insulating layer (2) itself arranged upon a semiconductor substrate (1), said electrodes being part of said first means for controlling transfer and making it possible to transfer along said registers, electrical charges generated by the light information they receive, in which said $m$ registers ($R_1$—$R_m$) are on the same semi-conductor substrate (1), and in which means (3) are provided in order to isolate the charges generated in one register from those generated in the neighbouring registers, wherein said second means for blocking said first means comprise means for controlling the potential $V_{SG}$ at the semi-conductor-insulator interface in the inter-electrode spaces of the different registers, said means placing said potential at a value which blocks the transfer in m-1 registers, and placing said potential at a value which enables transfer in the $m^{th}$ register.

5. An image device as claimed in claim 4, wherein said second means for controlling the interface potential in the interelectrode spaces of said $m$ registers, comprises a conductive grid made up of $m$ conductive bands ($G_1$, —$G_m$), each of said $m$ bands being formed on each of said $m$ registers ($R_1$, —$R_m$), said registers being previously covered with a layer of an insulating material (2), said bands ($G_1$,—$G_m$) of the grid being capable of placing the interfaces in the inter-electrode spaces of the register which they control, at predetermined potentials when they are supplied with predetermined control voltages.

6. An image device as claimed in claim 5, further comprising means for controlling said grid and applying to $m$-1 of its conductive bands, a blocking voltage $V_{GB}$ placing the interface potentials of the inter-electrode spaces of the $m$-1 corresponding registers at said value blocking transfer operations, and applying to the $m^{th}$ conductive band a transfer voltage $F_{GT}$ placing the interface potentials of the inter-electrode spaces of the corresponding register at said value which enables transfer to take place, said means controlling said grid, applying said transfer voltage $V_{GT}$ to each of the $m$ bands of said grid, for a time which is a function of the number $n$ of cells in the registers and the cell transfer time.

7. An image device as claimed in claim 6 wherein said means controlling said grid comprise a shift register (5) with $m$ stages and $m$ outputs respectively connected to the $m$ bands of said grid.

8. An image device as claimed in claim 4 wherein each of said $m$ registers comprises an electrical input (10, 11) for supplying it, during each transfer operation, with a background electrical charge ($Q_o$) saturating the surface states at the semiconductor-insulator interface of the register.

* * * * *